United States Patent
Khlat

(10) Patent No.: US 10,938,351 B2
(45) Date of Patent: Mar. 2, 2021

(54) ENVELOPE TRACKING SYSTEM

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/354,234

(22) Filed: Mar. 15, 2019

(65) Prior Publication Data

US 2020/0136563 A1 Apr. 30, 2020

Related U.S. Application Data

(60) Provisional application No. 62/753,473, filed on Oct. 31, 2018.

(51) Int. Cl.
*H04B 1/62* (2006.01)
*H03F 1/02* (2006.01)
(Continued)

(52) U.S. Cl.
CPC ............. *H03F 1/0233* (2013.01); *H03F 1/30* (2013.01); *H03F 3/245* (2013.01); *H03F 3/68* (2013.01);
(Continued)

(58) Field of Classification Search
CPC .......... H03F 1/0233; H03F 1/30; H03F 3/245; H03F 3/68; H03F 1/45071;
(Continued)

(56) References Cited

U.S. PATENT DOCUMENTS 5,838,732 A 11/1998 Carney
6,107,862 A 8/2000 Mukainakano et al.
(Continued)

FOREIGN PATENT DOCUMENTS

EP 3174199 A2 5/2017

OTHER PUBLICATIONS

Final Office Action for U.S. Appl. No. 15/986,948, dated Aug. 27, 2019, 9 pages.
(Continued)

*Primary Examiner* — Syed Haider
(74) *Attorney, Agent, or Firm* — Withrow & Terranova, P.L.L.C.

(57) ABSTRACT

An envelope tracking system having delay compensation circuitry is disclosed. The envelope tracking system includes transmit circuitry configured to receive an input transmit signal, a gain control signal, and delay compensation values. The envelope tracking system is further configured to generate an envelope tracking signal based on the input transmit signal, the gain control signal, and the delay compensation values, and generate an output transmit signal based on the input transmit signal. The envelope tracking system also includes a power amplifier configured to generate an amplified transmit signal based on the output transmit signal and an operating voltage. The envelope tracking system further includes an envelope tracking integrated circuit configured to control the operating voltage based on the envelope tracking signal. The delay compensation circuitry is configured to generate the delay compensation values based on a peak-to-average ratio of a given modulation type and the gain control signal.

20 Claims, 5 Drawing Sheets

(51) Int. Cl.
  *H03F 3/24* (2006.01)
  *H03F 3/68* (2006.01)
  *H03F 1/30* (2006.01)
  *H04L 27/26* (2006.01)
  *H03F 3/45* (2006.01)

(52) U.S. Cl.
  CPC ...... *H04L 27/2614* (2013.01); *H04L 27/2626* (2013.01); *H03F 3/45071* (2013.01); *H03F 2200/102* (2013.01); *H03F 2200/336* (2013.01); *H03F 2200/451* (2013.01)

(58) Field of Classification Search
  CPC ......... H03F 2200/102; H03F 2200/451; H03F 2200/336; H04L 27/2614; H04L 27/2626
  See application file for complete search history.

(56) References Cited

U.S. PATENT DOCUMENTS

| | | |
|---|---|---|
| 6,141,377 A | 10/2000 | Sharper et al. |
| 6,985,033 B1 | 1/2006 | Shirali et al. |
| 7,043,213 B2 | 5/2006 | Robinson et al. |
| 7,471,155 B1 | 12/2008 | Levesque |
| 7,570,931 B2 | 8/2009 | McCallister et al. |
| 8,461,928 B2 | 6/2013 | Yahav et al. |
| 3,493,141 A1 | 7/2013 | Khlat et al. |
| 8,718,188 B2 | 5/2014 | Balteanu et al. |
| 8,725,218 B2 | 5/2014 | Brown et al. |
| 8,774,065 B2 | 7/2014 | Khlat et al. |
| 8,803,603 B2 | 8/2014 | Wimpenny |
| 8,818,305 B1 | 8/2014 | Schwent et al. |
| 8,854,129 B2 | 10/2014 | Wilson |
| 8,879,665 B2 | 11/2014 | Xia et al. |
| 8,913,690 B2 | 12/2014 | Onishi |
| 8,989,682 B2 | 3/2015 | Ripley et al. |
| 9,020,451 B2 | 4/2015 | Khlat |
| 9,041,364 B2 | 5/2015 | Khlat |
| 9,041,365 B2 | 5/2015 | Kay et al. |
| 9,055,529 B2 | 6/2015 | Shih |
| 9,065,509 B1 | 6/2015 | Yan et al. |
| 9,069,365 B2 | 6/2015 | Brown et al. |
| 9,098,099 B2 | 8/2015 | Park et al. |
| 9,166,830 B2 | 10/2015 | Camuffo et al. |
| 9,167,514 B2 | 10/2015 | Dakshinamurthy et al. |
| 9,197,182 B2 | 11/2015 | Baxter et al. |
| 9,225,362 B2 | 12/2015 | Drogi et al. |
| 9,247,496 B2 | 1/2016 | Khlat |
| 9,263,997 B2 | 2/2016 | Vinayak |
| 9,270,239 B2 | 2/2016 | Drogi et al. |
| 9,271,236 B2 | 2/2016 | Drogi |
| 9,280,163 B2 | 3/2016 | Kay et al. |
| 9,288,098 B2 | 3/2016 | Yan et al. |
| 9,298,198 B2 | 3/2016 | Kay et al. |
| 9,344,304 B1 | 5/2016 | Cohen |
| 9,356,512 B2 | 5/2016 | Chowdhury et al. |
| 9,377,797 B2 | 6/2016 | Kay et al. |
| 9,379,667 B2 | 6/2016 | Khlat et al. |
| 9,515,622 B2 | 12/2016 | Nentwig et al. |
| 9,520,907 B2 | 12/2016 | Peng et al. |
| 9,584,071 B2 | 2/2017 | Khlat |
| 9,595,981 B2 | 3/2017 | Khlat |
| 9,596,110 B2 | 3/2017 | Jiang et al. |
| 9,614,477 B1 | 4/2017 | Rozenblit et al. |
| 9,748,845 B1 | 8/2017 | Kotikalapoodi |
| 9,806,676 B2 | 10/2017 | Balteanu et al. |
| 9,831,834 B2 | 11/2017 | Balteanu et al. |
| 9,837,962 B2 | 12/2017 | Mathe et al. |
| 9,923,520 B1 | 3/2018 | Abdelfattah et al. |
| 10,003,416 B1 | 6/2018 | Lloyd |
| 10,090,808 B1 | 10/2018 | Henzler et al. |
| 10,097,145 B1 | 10/2018 | Khlat et al. |
| 10,110,169 B2 | 10/2018 | Khesbak et al. |
| 10,158,329 B1 | 12/2018 | Khlat |
| 10,158,330 B1 | 12/2018 | Khlat |
| 10,170,989 B2 | 1/2019 | Balteanu et al. |
| 10,291,181 B2 | 5/2019 | Kim et al. |
| 10,382,071 B2 | 8/2019 | Rozek et al. |
| 2002/0167827 A1 | 11/2002 | Umeda et al. |
| 2004/0266366 A1 | 12/2004 | Robinson et al. |
| 2005/0090209 A1 | 4/2005 | Behzad |
| 2005/0227646 A1* | 10/2005 | Yamazaki ........... H03F 3/45192 455/127.3 |
| 2005/0232385 A1 | 10/2005 | Yoshikawa et al. |
| 2006/0240786 A1 | 10/2006 | Liu |
| 2007/0052474 A1 | 3/2007 | Saito |
| 2007/0258602 A1* | 11/2007 | Vepsalainen ......... H03F 1/0227 381/104 |
| 2009/0016085 A1 | 1/2009 | Rader et al. |
| 2009/0045872 A1 | 2/2009 | Kenington |
| 2009/0191826 A1 | 7/2009 | Takinami et al. |
| 2010/0308919 A1 | 12/2010 | Adamski et al. |
| 2011/0074373 A1 | 3/2011 | Lin |
| 2011/0136452 A1 | 6/2011 | Pratt et al. |
| 2011/0175681 A1 | 7/2011 | Inamori et al. |
| 2011/0279179 A1 | 11/2011 | Vice |
| 2012/0194274 A1 | 8/2012 | Fowers et al. |
| 2012/0200435 A1 | 8/2012 | Ngo et al. |
| 2012/0299645 A1 | 11/2012 | Southcombe et al. |
| 2012/0299647 A1 | 11/2012 | Honjo et al. |
| 2013/0021827 A1 | 1/2013 | Ye |
| 2013/0100991 A1 | 4/2013 | Woo |
| 2013/0130724 A1 | 5/2013 | Kumar Reddy et al. |
| 2013/0162233 A1 | 6/2013 | Marty |
| 2013/0187711 A1 | 7/2013 | Goedken et al. |
| 2013/0200865 A1 | 8/2013 | Wimpenny |
| 2014/0009226 A1 | 1/2014 | Severson |
| 2014/0028370 A1 | 1/2014 | Wimpenny |
| 2014/0028390 A1 | 1/2014 | Davis |
| 2014/0057684 A1* | 2/2014 | Khlat ............... H04W 52/0209 455/574 |
| 2014/0103995 A1 | 4/2014 | Langer |
| 2014/0155002 A1 | 6/2014 | Dakshinamurthy et al. |
| 2014/0184335 A1 | 7/2014 | Nobbe et al. |
| 2014/0199949 A1* | 7/2014 | Nagode .................. H03G 3/00 455/73 |
| 2014/0210550 A1 | 7/2014 | Mathe et al. |
| 2014/0218109 A1 | 8/2014 | Wimpenny |
| 2014/0235185 A1 | 8/2014 | Drogi |
| 2014/0266423 A1 | 9/2014 | Drogi et al. |
| 2014/0266428 A1 | 9/2014 | Chiron et al. |
| 2014/0315504 A1 | 10/2014 | Sakai et al. |
| 2014/0361830 A1 | 12/2014 | Mathe et al. |
| 2015/0048883 A1 | 2/2015 | Vinayak |
| 2015/0071382 A1 | 3/2015 | Wu et al. |
| 2015/0098523 A1 | 4/2015 | Lim et al. |
| 2015/0155836 A1 | 6/2015 | Midya et al. |
| 2015/0188432 A1 | 7/2015 | Vannorsdel et al. |
| 2015/0236654 A1 | 8/2015 | Jiang et al. |
| 2015/0236729 A1 | 8/2015 | Peng et al. |
| 2015/0280652 A1 | 10/2015 | Cohen |
| 2015/0333781 A1 | 11/2015 | Alon et al. |
| 2016/0065137 A1 | 3/2016 | Khlat |
| 2016/0099687 A1 | 4/2016 | Khlat |
| 2016/0105151 A1 | 4/2016 | Langer |
| 2016/0118941 A1 | 4/2016 | Wang |
| 2016/0126900 A1 | 5/2016 | Shute |
| 2016/0173031 A1* | 6/2016 | Langer .................... H03F 3/19 330/126 |
| 2016/0181995 A1 | 6/2016 | Nentwig et al. |
| 2016/0187627 A1 | 6/2016 | Abe |
| 2016/0197627 A1 | 7/2016 | Qin et al. |
| 2016/0226448 A1 | 8/2016 | Wimpenny |
| 2016/0294587 A1 | 10/2016 | Jiang et al. |
| 2017/0141736 A1 | 5/2017 | Pratt et al. |
| 2017/0302183 A1 | 10/2017 | Young |
| 2017/0317913 A1 | 11/2017 | Kim et al. |
| 2017/0338773 A1 | 11/2017 | Balteanu et al. |
| 2018/0048265 A1 | 2/2018 | Nentwig |
| 2018/0048276 A1 | 2/2018 | Khlat et al. |
| 2018/0076772 A1 | 3/2018 | Khesbak et al. |
| 2018/0123453 A1 | 5/2018 | Puggelli et al. |
| 2018/0288697 A1 | 10/2018 | Camuffo et al. |
| 2018/0302042 A1* | 10/2018 | Zhang .................. H03F 1/3282 |

(56) References Cited

U.S. PATENT DOCUMENTS

| | | | |
|---|---|---|---|
| 2018/0309414 | A1 | 10/2018 | Khlat et al. |
| 2018/0367101 | A1 | 12/2018 | Chen et al. |
| 2019/0068234 | A1 | 2/2019 | Khlat |
| 2019/0097277 | A1 | 3/2019 | Fukae |
| 2019/0109566 | A1 | 4/2019 | Folkmann et al. |
| 2019/0109613 | A1 | 4/2019 | Khlat et al. |
| 2019/0238095 | A1 | 8/2019 | Khlat |
| 2019/0267956 | A1 | 8/2019 | Granger-Jones et al. |
| 2020/0007090 | A1 | 1/2020 | Khlat et al. |
| 2020/0136561 | A1 | 4/2020 | Khlat et al. |
| 2020/0136575 | A1 | 4/2020 | Khlat et al. |
| 2020/0153394 | A1 | 5/2020 | Khlat et al. |

OTHER PUBLICATIONS

Final Office Action for U.S. Appl. No. 16/018,426, dated Sep. 4, 2019, 12 pages.
Non-Final Office Action for U.S. Appl. No. 14/836,634, dated May 16, 2016, 9 pages.
Non-Final Office Action for U.S. Appl. No. 14/868,890, dated Jul. 14, 2016, 13 pages.
Non-Final Office Action for U.S. Appl. No. 15/792,909, dated May 18, 2018, 13 pages.
Notice of Allowance for U.S. Appl. No. 15/459,449, dated Mar. 28, 2018, 7 pages.
Notice of Allowance for U.S. Appl. No. 15/723,460, dated Jul. 24, 2018, 8 pages.
Notice of Allowance for U.S. Appl. No. 15/704,131, dated Jul. 17, 2018, 7 pages.
Notice of Allowance for U.S. Appl. No. 15/728,202, dated Aug. 2, 2018, 7 pages.
Non-Final Office Action for U.S. Appl. No. 15/888,300, dated Aug. 28, 2018, 11 pages.
Notice of Allowance for U.S. Appl. No. 15/792,909, dated Dec. 19, 2018, 11 pages.
Notice of Allowance for U.S. Appl. No. 15/993,705, dated Oct. 31, 2018, 7 pages.
Pfister, Henry, "Discrete-Time Signal Processing," Lecture Note, pfisteree.duke.edu/courses/ece485/dtsp.pdf, Mar. 3, 2017, 22 pages.
Non-Final Office Action for U.S. Appl. No. 15/888,260, dated May 2, 2019, 14 pages.
Non-Final Office Action for U.S. Appl. No. 15/986,948, dated Mar. 28, 2019, 8 pages.
Non-Final Office Action for U.S. Appl. No. 16/018,426, dated Apr. 11, 2019, 11 pages.
Supplemental Notice of Allowability for U.S. Appl. No. 15/902,244, dated Mar. 20, 2019, 6 pages.
Notice of Allowance for U.S. Appl. No. 15/902,244, dated Feb. 8, 2019, 8 pages.
Advisory Action for U.S. Appl. No. 15/888,300, dated Jun. 5, 2019, 3 pages.
Notice of Allowance for U.S. Appl. No. 15/984,566, dated May 21, 2019, 6 pages.
Notice of Allowance for U.S. Appl. No. 16/150,556, dated Jul. 29, 2019, 7 pages.
Non-Final Office Action for U.S. Appl. No. 15/888,300, dated Jun. 27, 2019, 17 pages.
U.S. Appl. No. 15/984,566, filed May 21, 2018.
U.S. Appl. No. 15/986,948, filed May 23, 2018.
U.S. Appl. No. 16/018,426, filed Jun. 26, 2018.
U.S. Appl. No. 16/246,859, filed Jan. 14, 2019.
U.S. Appl. No. 16/174,535, filed Oct. 30, 2018.
Advisory Action for U.S. Appl. No. 15/986,948, dated Nov. 8, 2019, 3 pages.
Notice of Allowance for U.S. Appl. No. 15/986,948, dated Dec. 13, 2019, 7 pages.
Advisory Action for U.S. Appl. No. 16/018,426, dated Nov. 19, 2019, 3 pages.
Notice of Allowance for U.S. Appl. No. 16/180,887, dated Jan. 13, 2020, 8 pages.
Notice of Allowance for U.S. Appl. No. 15/888,300, dated Jan. 14, 2020, 11 pages.
Non-Final Office Action for U.S. Appl. No. 16/122,611, dated Mar. 11, 2020, 16 pages.
Corrected Notice of Allowability for U.S. Appl. No. 15/888,300, dated Feb. 25, 2020, 7 pages.
Notice of Allowance for U.S. Appl. No. 16/018,426, dated Mar. 31, 2020, 7 pages.
Non-Final Office Action for U.S. Appl. No. 16/174,535, dated Feb. 4, 2020, 7 pages.
Notice of Allowance for U.S. Appl. No. 16/155,127, dated Jun. 1, 2020, 8 pages.
Corrected Notice of Allowability for U.S. Appl. No. 15/888,300, dated May 13, 2020, 7 pages.
Non-Final Office Action for U.S. Appl. No. 16/246,859, dated Apr. 28, 2020, 9 pages.
Final Office Action for U.S. Appl. No. 16/122,611, dated Sep. 18, 2020, 17 pages.
Final Office Action for U.S. Appl. No. 16/174,535, dated Jul. 1, 2020, 7 pages.
Notice of Allowance for U.S. Appl. No. 16/246,859, dated Sep. 18, 2020, 8 pages.
Non-Final Office Action for U.S. Appl. No. 16/284,023, dated Jun. 24, 2020, 7 pages.
Quayle Action for U.S. Appl. No. 16/421,905, dated Aug. 25, 2020, 5 pages.
Non-Final Office Action for U.S. Appl. No. 16/435,940, dated Jul. 23, 2020, 6 pages.
Non-Final Office Action for U.S. Appl. No. 16/774,060, dated Aug. 17, 2020, 6 pages.
Notice of Allowance for U.S. Appl. No. 16/122,611, dated Dec. 1, 2020, 9 pages.
Advisory Action for U.S. Appl. No. 16/174,535, dated Sep. 24, 2020, 3 pages.
Notice of Allowance for U.S. Appl. No. 16/174,535, dated Oct. 29, 2020, 7 pages.
Final Office Action for U.S. Appl. No. 16/284,023, dated Nov. 3, 2020, 7 pages.
Non-Final Office Action for U.S. Appl. No. 16/416,812, dated Oct. 16, 2020, 8 pages.
Non-Final Office Action for U.S. Appl. No. 16/514,051, dated Nov. 13, 2020, 9 pages.
Quayle Action for U.S. Appl. No. 16/589,940, dated Dec. 4, 2020, 8 pages.
Notice of Allowance for U.S. Appl. No. 16/435,940, dated Dec. 21, 2020, 7 pages.

\* cited by examiner

ENVELOPE TRACKING SYSTEM

RELATED APPLICATIONS

This application claims the benefit of provisional patent application Ser. No. 62/753,473, filed Oct. 31, 2018, the disclosure of which is hereby incorporated herein by reference in its entirety.

FIELD OF THE DISCLOSURE

The technology of the disclosure relates generally to envelope tracking power management in wireless communication devices.

BACKGROUND

Mobile communication devices have become increasingly common in current society. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as Long-Term Evolution (LTE). To achieve the higher data rates in mobile communication devices, sophisticated power amplifiers (PAs) may be employed to increase output power of radio frequency (RF) signals (e.g., maintaining sufficient energy per bit) communicated by mobile communication devices. However, the increased output power of RF signals can lead to increased power consumption and thermal dissipation in mobile communication devices, thus compromising overall performance and user experiences.

Envelope tracking is a power management technology designed to improve efficiency levels of PAs to help reduce power consumption and thermal dissipation in mobile communication devices. As the name suggests, envelope tracking employs a system that keeps track of the amplitude envelope of the RF signals communicated by mobile communication devices. The envelope tracking system constantly adjusts supply voltages applied to the PAs to ensure that the PAs are operating at a higher efficiency for a given instantaneous output power requirement of the RF signals.

However, the envelope tracking system can only maintain good linearity and high efficiency up to an inherent bandwidth limit. In the advent of fifth-generation New Radio (5G-NR) technology, the RF signals may be modulated with a higher bandwidth (e.g., >100 MHz) than the inherent bandwidth limit of the envelope tracking system, thus reducing linearity and efficiency of the envelope tracking system. As such, it may be desirable to improve linearity and efficiency of the envelope tracking system to support the 5G-NR technology.

SUMMARY

An envelope tracking system having delay compensation circuitry is disclosed. The envelope tracking system includes transmit circuitry configured to receive an input transmit signal, a gain control signal, and delay compensation values. The envelope tracking system is further configured to generate an envelope tracking signal based on the input transmit signal, the gain control signal, and the delay compensation values, and generate an output transmit signal based on the input transmit signal. The envelope tracking system also includes a power amplifier configured to generate an amplified transmit signal based on the output transmit signal and an operating voltage. The envelope tracking system further includes an envelope tracking integrated circuit configured to control the operating voltage based on the envelope tracking signal. The delay compensation circuitry is configured to generate the delay compensation values based on a peak-to-average ratio of a given modulation type and the gain control signal.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
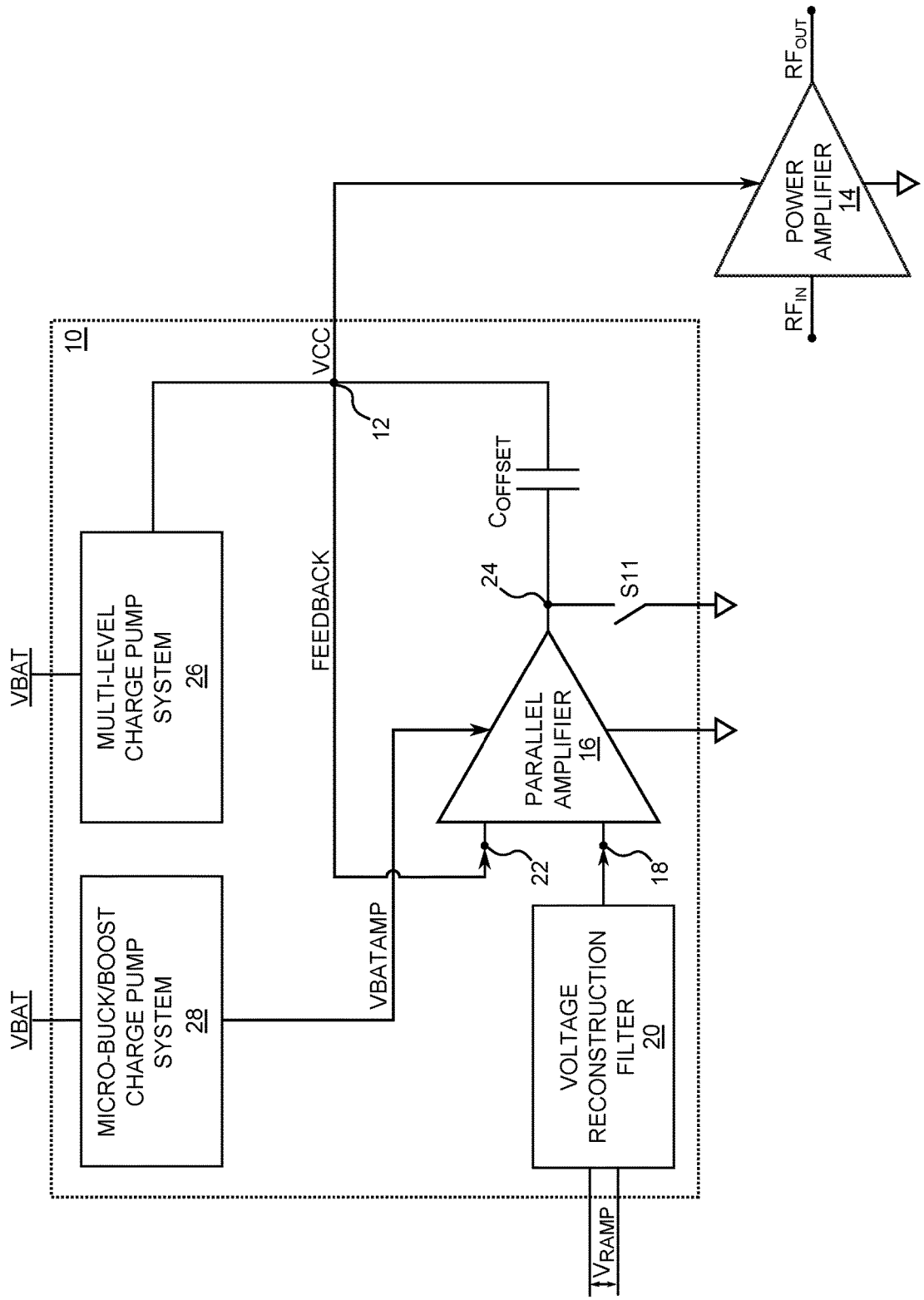
FIG. 1 is a block diagram of an envelope tracking integrated circuit.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 is a block diagram of an envelope tracking integrated circuit 10 having a envelope voltage terminal 12 that is coupled to a supply rail of a power amplifier 14. The envelope tracking integrated circuit 10 includes a parallel amplifier 16 that is configured to control a modulated operating voltage VCC that supplies power to the power amplifier 14. The parallel amplifier 16 has a signal input terminal 18 coupled to a voltage reconstruction filter 20 that outputs a reconstructed and filtered version of an envelope tracking signal $V_{RAMP}$ that the parallel amplifier 16 amplifies to modulate power being supplied to the power amplifier 14. The parallel amplifier 16 has a feedback input terminal 22 that is coupled to the envelope voltage terminal 12. Feedback from the envelope voltage terminal 12 forces an output voltage at an output terminal 24 of the parallel amplifier to follow the envelope tracking signal $V_{RAMP}$. An offset capacitor $C_{OFFSET}$ is coupled between the output terminal 24 and the envelope voltage terminal 12. A switch S11 is coupled between the output terminal 24 and a fixed voltage node such as ground. The switch S11 may be momentarily closed to discharge the offset capacitor $C_{OFFSET}$.

A multi-level charge pump system 26 provides power to the power amplifier 14 through the envelope voltage terminal 12. Raw power for the multi-level charge pump system is typically provided by a battery source VBAT. The battery source VBAT may also provide power through a micro-buck/boost charge pump system 28 that provides a supply voltage VBATAMP to the parallel amplifier 16.

Figure 2:
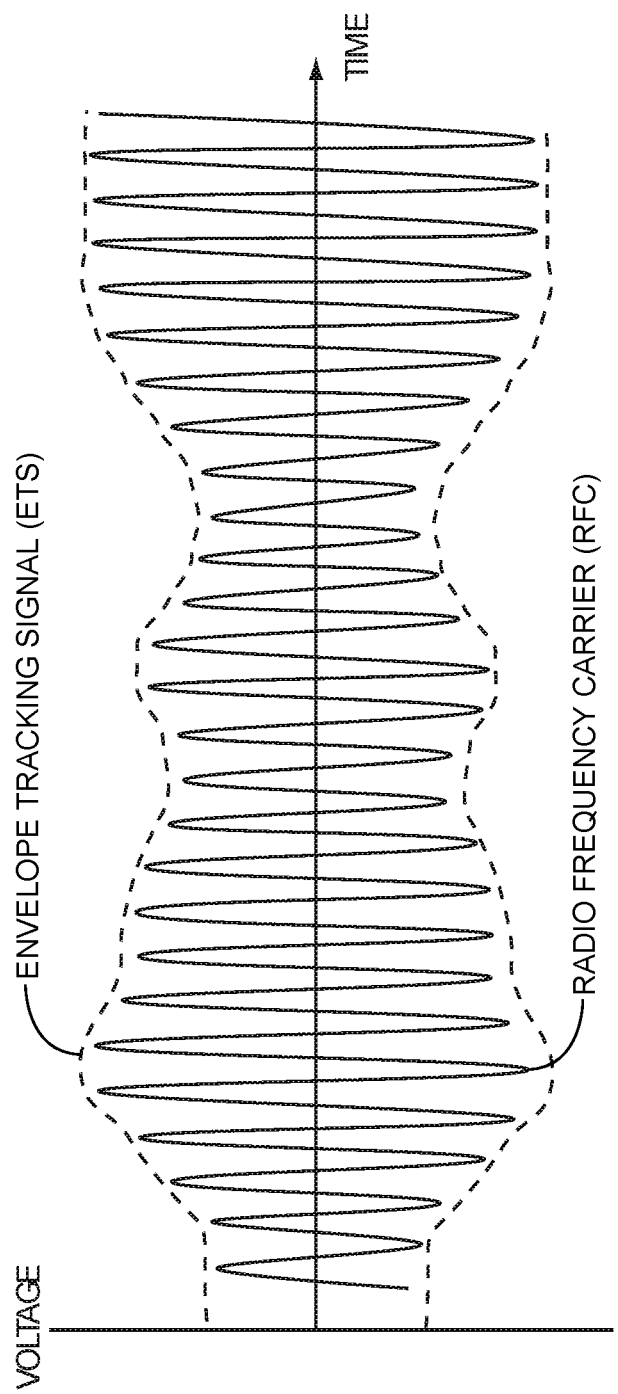
FIG. 2 is an exemplary diagram of an envelope tracking signal that tracks amplitude modulation of a radio frequency signal that is amplified by one or more amplifier stages.

FIG. 2 is an exemplary diagram of an envelope tracking signal that tracks amplitude modulation of a radio frequency carrier signal that is amplified by one or more amplifier stages such as power amplifier 14 (FIG. 1). It is desirable for the envelope tracking signal to be in synchronization with the amplitude modulation of the radio frequency signal. However, with regard to very wide modulation bandwidth such as 5G-NR 100 MHz, a problem exits in that fine tuning of a delay between the amplitude modulation of the radio frequency carrier signal and the modulated operating voltage VCC must be precisely controlled to meet linearity requirements while also improving overall system efficiency. In at least one exemplary embodiment, the modulated operating voltage VCC is a collector voltage. However, depending on the type of amplifier, the modulated operating voltage may a drain voltage or a source voltage.

Figure 3:
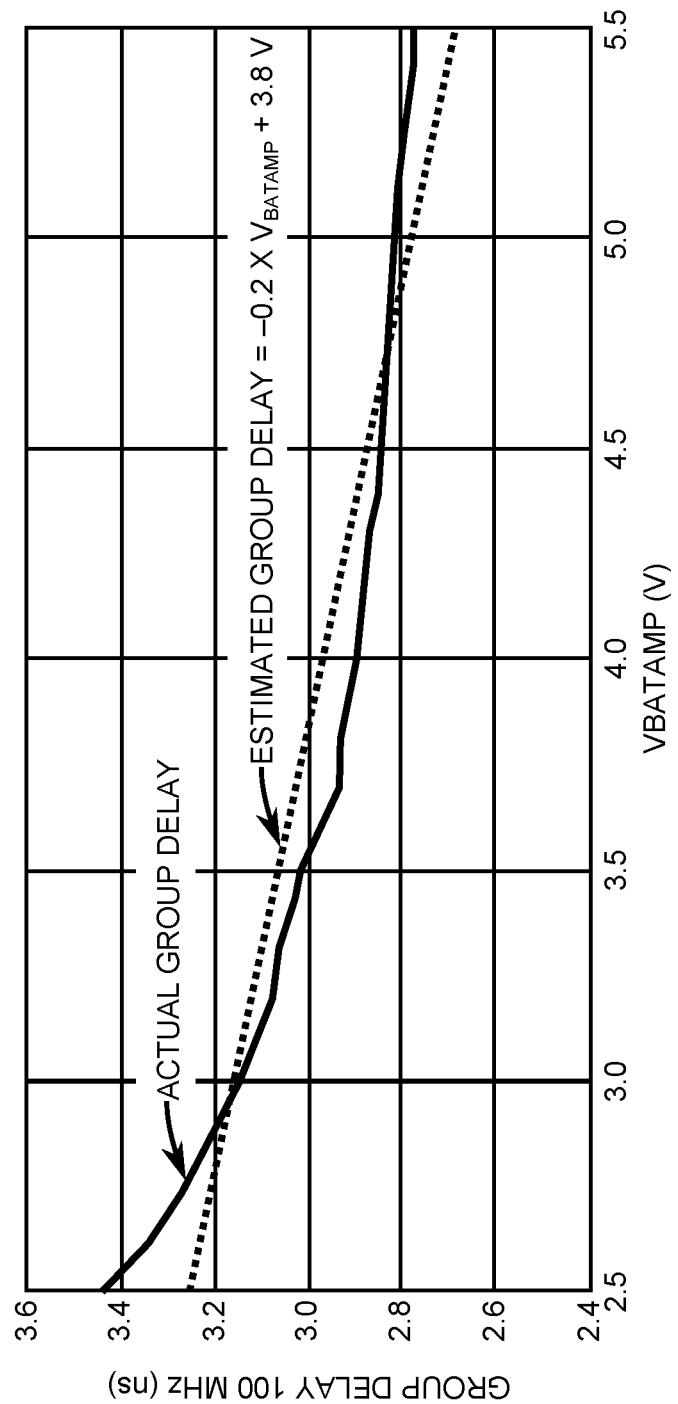
FIG. 3 is an exemplary graph of group delay for an envelope tracking signal versus supply voltage for a parallel amplifier of the envelope tracking integrated circuit.

In this regard, FIG. 3 is an exemplary graph of group delay for a 100 MHz envelope tracking signal versus the supply voltage VBATAMP. A best fit linear equation for estimated group delay is presented in the graph. The equation is usable for generating a delay compensation lookup table (LUT) that maps digital delay compensation values to digital values representing the supply voltage VBATAMP.

Figure 4:
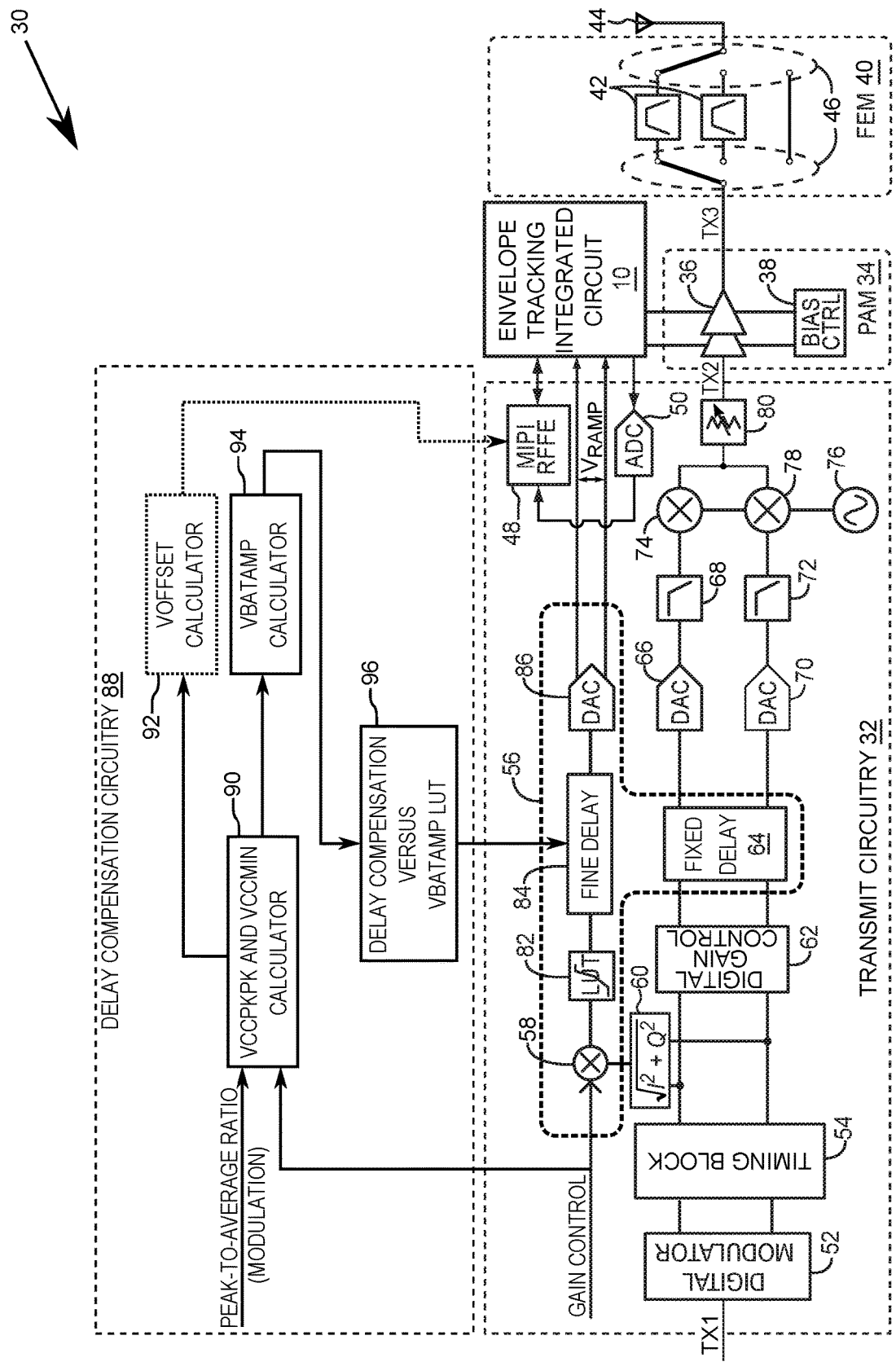
FIG. 4 is a block diagram of a digital envelope tracking system that in accordance with the present disclosure is configured to use digital delay compensation values versus supply voltage to provide precise envelope tracking for very wide modulation bandwidth such as 5G-NR 100 MHz.

FIG. 4 is a block diagram of an envelope tracking system 30 that is configured to use digital delay compensation values to provide precise envelope tracking for very wide modulation bandwidth such as 5G-NR 100 MHz. The envelope tracking system 30 includes a transmit circuitry 32 that drives a power amplifier module (PAM) 34 having power amplifier stages 36 with a bias control 38. A front-end module (FEM) 40 receives the output from the PAM 34 and passes the output through selectable filters 42 to a transmit antenna 44 via radio frequency (RF) switches 46. The envelope tracking integrated circuit 10 supplies power to the PAM 34. The envelope tracking integrated circuit 10 is controlled through a mobile industry processor interface (MIPI) RF front-end (RFFE) standard interface 48. A general purpose analog-to-digital converter (ADC) 50 is usable to monitor supply voltages provided to the PAM 34 by the envelope tracking integrated circuit 10.

The transmit circuitry 32 also includes a digital modulator 52 that separates an input transmit signal TX1 into a digital in-phase (I) signal and a digital quadrature (Q) signal. A timing block 54 provides timing advances and delays for the digital I signal and the digital Q signal in response to base station requests. The timing block 54 also provides interpolation for achieving higher clock frequencies.

The transmit circuitry 32 includes an envelope tracking signal (ETS) generator 56 that drives the envelope tracking integrated circuit 10 to produce the ETS (FIG. 2). A digital log gain to digital linear gain multiplier 58 receives log gain values contained within a digital gain control (GainControl) signal along with a stream of norm outputs from a coordinate rotation digital computer 60 that calculates magnitudes of the digital I signal and the digital Q signal. The digital log gain to digital linear gain multiplier 58 is configured to multiply the stream of norms by log gain values contained within the gain control signal to generate a digital envelope tracking signal.

A digital gain control 62 provides gain to the digital I signal and the digital Q signal in cooperation with the GainControl signal. The cooperation ensures that the amplitude of the ETS (FIG. 2) and the amplitude of the radio frequency carrier (RFC; FIG. 2) match within at least ±5% such that the amplitude of the RFC is not clipped. In at least one embodiment, the digital gain control 62 provides gain to both the I signal and the Q signal.

A fixed delay 64 on the order of nanoseconds ensures that the stream of norm values is synchronized with the propagation of the digital I signal and the digital Q signal that are output from the digital gain control 62. A first digital-to-analog converter (DAC) 66 converts the digital I signal into an analog I signal that is filtered by a first filter 68. Similarly, a second DAC 70 converts the digital Q signal into an analog Q signal that is filtered by a second filter 72.

A first mixer 74 mixes the analog I signal with an RF signal generated by an RF oscillator 76. A second mixer 78 mixes the analog Q signal with the RF signal. Mixed outputs from the first mixer 74 and the second mixer 78 combine to produce the modulated RFC shown in FIG. 2. A variable attenuator 80 is usable in cooperation with the GainControl signal to adjust the gain of the RFC. In this exemplary embodiment, an output transmit signal TX2 is output from the transmit circuitry 32 to the power amplifier stages 36 by way of the variable attenuator 80. The power amplifier stages 36 amplify the output transmit signal TX2 to generate an amplified transmit signal TX3 that is fed through the FEM 40 to the antenna 44.

The ETS generator 56 includes the digital log gain to digital linear gain multiplier 58 that multiplies GainControl with the stream of norm values output from the coordinate rotation digital computer 60. A pre-distortion lookup table (LUT) 82 provides pre-distortion to the stream of norms to match distortion produced by the power amplifier stages 36. A digitally adjustable fine delay 84 is usable to finely tune synchronization between ETS and the RFC (FIG. 2). The ETS generator 56 also includes a third DAC 86 for converting the stream of norm values into a differential output that drives the envelope tracking integrated circuit 10 with a differential voltage ramp signal $V_{RAMP}$ to modulate power being supplied to the PAM 34.

A delay compensation circuitry 88 includes an operating voltage peak-to-peak (VCCPKPK) and minimum (VCCMIN) calculator 90 that receives gain control values and peak-to-average ratio (PAR) values for a given modulation type, both of which are processed by the VCCPKPK and VCCMIN calculator 90. An envelope peak is calculated by the VCCPKPK and VCCMIN calculator 90 using the relationship that states the envelope peak=(Average VCC)·$10^{(PAR/20)}$. An operating voltage peak VCCPK corresponding to envelope peak is determined by the VCCPKPK and VCCMIN calculator 90 by way of an internal LUT or by calculation. The VCCPKPK and VCCMIN calculator 90 then calculates VCCPKPK using the relationship VCCPKPK=VCCPK−VCC minimum.

An optional offset voltage (VOFFSET) calculator 92 receives output from the VCCPKPK and VCCMIN calculator 90, which is processed by the VOFFSET calculator 92 and may be output to the MIPI-RFFE standard interface 48 or alternatively sent to external circuitry (not shown). A VBATAMP calculator 94 also receives output from the VCCPKPK and VCCMIN calculator 90, which the VBATAMP calculator processes to predict what the supply voltage VBATAMP is or will be. In at least one embodiment, a calculated supply voltage VBATAMP is equal to VCCPKPK minus a given headroom. Moreover, in at least some embodiments, the calculated supply voltage VBATAMP is a root mean square voltage.

A delay compensation versus VBATAMP LUT 96 receives a stream of predicted values for the calculated supply voltage VBATAMP and in turn outputs a stream of digital delay compensation values to the digitally adjustable fine delay 84 of the transmit circuitry 32. The digitally adjustable fine delay 84 receives the stream of digital delay compensation values and continuously provides a fine delay that tunes synchronization between the ETS and the output transmit signal TX2. In particular, the digitally adjustable fine delay 84 provides a fine delay in a range of tenths of nanoseconds that tunes synchronization between the amplitude modulation of the RFC signal and the modulated operating voltage VCC.

Figure 5:
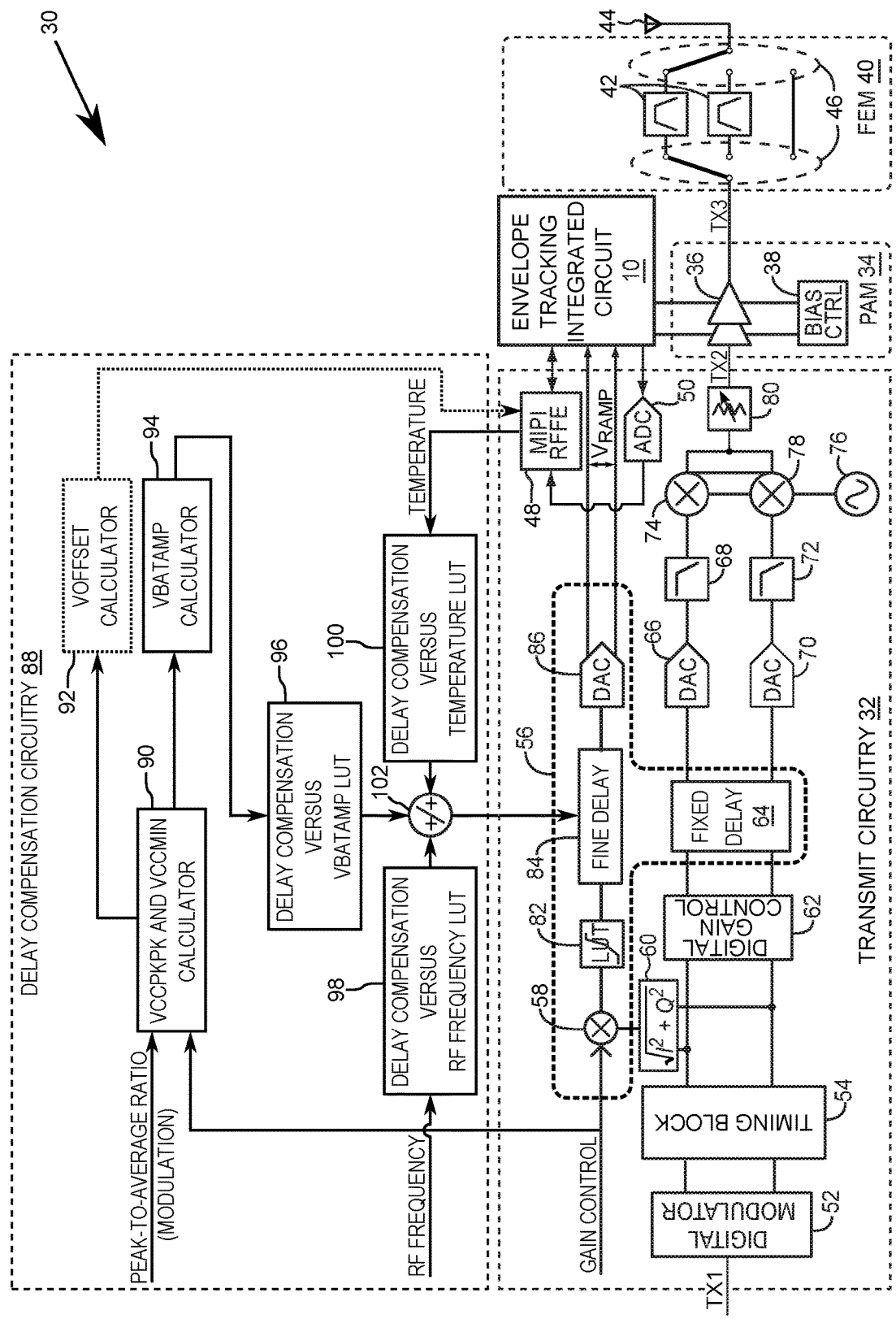
FIG. 5 is a block diagram of the digital envelope tracking system that is further configured to use digital delay compensation values versus temperature and radio frequency to provide precise envelope tracking for very wide modulation bandwidth such as 5G-NR 100 MHz.

FIG. 5 is a block diagram of an embodiment of the envelope tracking system 30 that is further configured to use digital delay compensation values versus temperature and RF frequency to provide precise envelope tracking for very wide modulation bandwidth such as 5G-NR 100 MHz. In this exemplary embodiment, the delay compensation circuitry 88 further includes a delay compensation versus RF frequency LUT 98 that receives RF frequency information and outputs delay compensation values that map to the RF frequency information. The RF frequency information is typically provided to the delay compensation versus RF frequency LUT 98 from a baseband processor (not shown).

As depicted in FIG. 5, the delay compensation circuitry 88 further includes a delay compensation versus temperature LUT 100 that receives temperature data from the envelope tracking integrated circuit 10 by way of the the MIPI-RFFE standard interface 48. The delay compensation versus temperature LUT 100 outputs delay compensation values that map to the temperature data. A digital summing node 102 combines the delay compensation values from the delay compensation versus VBATAMP LUT 96, the delay compensation versus RF frequency LUT 98, and the delay compensation versus temperature LUT 100, and outputs a resultant delay compensation stream to the digitally adjustable fine delay 84. In response, the digitally adjustable fine delay 84 continuously provides a fine delay that maintains synchronization between the amplitude modulation of the RFC signal and the modulated operating voltage VCC.

Those skilled in the art will recognize improvements and modifications to the preferred embodiments of the present disclosure. All such improvements and modifications are considered within the scope of the concepts disclosed herein and the claims that follow.

What is claimed is:

1. An envelope tracking system comprising:
   transmit circuitry configured to:
      receive an input transmit signal;
      receive a gain control signal;
      receive delay compensation values;
      generate an envelope tracking signal based upon the input transmit signal, the gain control signal, and the delay compensation values; and
      generate an output transmit signal based upon the input transmit signal;
   a power amplifier configured to generate an amplified transmit signal based upon the output transmit signal and an operating voltage;

an envelope tracking integrated circuit configured to control the operating voltage based upon the envelope tracking signal; and delay compensation circuitry configured to generate the delay compensation values based on a peak-to-average ratio of a given modulation type and the gain control signal.

2. The envelope tracking system of claim 1 wherein the envelope tracking integrated circuit comprises a parallel amplifier configured to control the operating voltage based on the envelope tracking signal and a supply voltage to the parallel amplifier.

3. The envelope tracking system of claim 2 further comprising a delay compensation values versus supply voltage values lookup table, wherein the delay compensation circuitry is configured to output delay compensation values associated with corresponding supply voltage values.

4. The envelope tracking system of claim 3 wherein the supply voltage values represent root mean square voltage.

5. The envelope tracking system of claim 1 wherein the delay compensation circuitry includes a delay compensation values versus temperature lookup table, wherein the delay compensation circuitry is configured to output delay compensation values associated with corresponding temperature values.

6. The envelope tracking system of claim 5 wherein the corresponding temperature values represent the temperature of the envelope tracking integrated circuit.

7. The envelope tracking system of claim 1 wherein the delay compensation circuitry includes a delay compensation values versus radio frequency (RF) frequency lookup table, wherein the delay compensation circuitry is configured to output delay compensation values associated with corresponding RF frequency values that represent the frequency of the input transmit signal.

8. The envelope tracking system of claim 2 further comprising a delay compensation values versus supply voltage values lookup table and a delay compensation values versus temperature lookup table, wherein the delay compensation circuitry is configured to output delay compensation values associated with corresponding supply voltage values and corresponding temperature values.

9. The envelope tracking system of claim 8 wherein the corresponding temperature values represent the temperature of the envelope tracking integrated circuit.

10. The envelope tracking system of claim 2 further comprising a delay compensation values versus supply voltage values lookup table and a delay compensation values versus RF frequency lookup table, wherein the delay compensation circuitry is configured to output delay compensation values associated with corresponding supply voltage values and corresponding RF frequency values that represent the frequency of the input transmit signal.

11. The envelope tracking system of claim 2 further comprising a delay compensation values versus supply voltage values lookup table, a delay compensation values versus temperature lookup table, and a delay compensation values versus RF frequency lookup table, wherein the delay compensation circuitry is configured to output delay compensation values associated with corresponding supply voltage values, corresponding temperature values, and corresponding RF frequency values that represent the frequency of the input transmit signal.

12. The envelope tracking system of claim 11 wherein the corresponding temperature values represent the temperature of the envelope tracking integrated circuit.

13. The envelope tracking system of claim 1 wherein the envelope tracking signal has a frequency of at least 100 MHz.

14. The envelope tracking system of claim 1 wherein the transmit circuitry includes a digital modulator configured to separate the input transmit signal into a digital in-phase (I) signal and a digital quadrature (Q) signal.

15. The envelope tracking system of claim 1 wherein the transmit circuitry further includes a coordinate rotation digital computer configured to provide a stream of norms to the envelope tracking circuitry by calculating magnitudes of a digital I signal and a digital Q signal.

16. The envelope tracking system of claim 15 wherein the transmit circuitry further includes an envelope tracking signal generator that is configured to drive the envelope tracking integrated circuit with the envelope tracking signal.

17. The envelope tracking system of claim 16 wherein the envelope tracking signal generator includes a digital log gain to digital linear gain multiplier configured to multiply the stream of norms by log gain values contained within the gain control signal to generate the envelope tracking signal.

18. The envelope tracking system of claim 17 wherein the envelope tracking signal generator includes a digitally adjustable fine delay configured to receive the delay compensation values and tune synchronization between the envelope tracking signal and the output transmit signal.

19. The envelope tracking system of claim 18 wherein the envelope tracking signal generator further includes a digital-to-analog converter configured to convert output from the digitally adjustable fine delay into the envelope tracking signal.

20. The envelope tracking system of claim 19 wherein the envelope tracking signal is a differential signal.

* * * * *